US009369155B2

(12) United States Patent
Baik et al.

(10) Patent No.: US 9,369,155 B2
(45) Date of Patent: Jun. 14, 2016

(54) APPARATUS AND METHOD FOR TRANSMITTING DATA USING FOUNTAIN CODE IN WIRELESS COMMUNICATION SYSTEM

(71) Applicants: Samsung Electronics Co., Ltd., Suwon-si, Gyeonggi-do (KR); Korea University Research and Business Foundation, Seoul (KR)

(72) Inventors: Jong-Hyun Baik, Seongnam-si (KR); YoungKil Suh, Mokpo-si (KR); Sung-Won Kim, Seoul (KR); Jun Heo, Seoul (KR)

(73) Assignees: Samsung Electronics Co., Ltd., Suwon-si (KR); Korea University Research and Business Foundation, Seoul (KR)

( * ) Notice: Subject to any disclaimer, the term of this patent is extended or adjusted under 35 U.S.C. 154(b) by 0 days.

(21) Appl. No.: 14/242,216

(22) Filed: Apr. 1, 2014

(65) Prior Publication Data
US 2014/0294118 A1 Oct. 2, 2014

(30) Foreign Application Priority Data
Apr. 1, 2013 (KR) .................. 10-2013-0035066

(51) Int. Cl.
*H03M 13/37* (2006.01)
*H03M 13/35* (2006.01)
*H04L 1/00* (2006.01)

(52) U.S. Cl.
CPC ........ *H03M 13/3761* (2013.01); *H03M 13/353* (2013.01); *H04L 1/0009* (2013.01); *H04L 1/0041* (2013.01)

(58) Field of Classification Search
CPC ............ H03M 13/3761; H03M 13/353; H04L 1/0009
USPC ........................................... 375/295
See application file for complete search history.

(56) References Cited

U.S. PATENT DOCUMENTS 8,887,020 B2 * 11/2014 Shokrollahi ...... H03M 13/3761
714/752
2003/0103573 A1 * 6/2003 Woo ................. H04N 19/00
375/245

(Continued)

FOREIGN PATENT DOCUMENTS

KR 10-1145673 B1 5/2012

OTHER PUBLICATIONS

Sejdinovic, D.; Piechocki, R.J.; Doufexi, A.; Ismail, M., "Fountain Code Design for Data Multicast With Side Information," Wireless Communications, IEEE Transactions On , vol. 8, No. 10, pp. 5155,5165, Oct. 2009.*

(Continued)

*Primary Examiner* — Daniel Washburn
*Assistant Examiner* — Berhanu Tadese
(74) *Attorney, Agent, or Firm* — Jefferson IP Law, LLP (57) ABSTRACT

An apparatus and a method for transmitting data using a fountain code are provided. The method for transmitting data includes determining a degree distribution of a fountain code based on erasure rate information regarding at least one receiving end, performing fountain encoding according to the degree distribution, and transmitting symbols generated by the fountain encoding.

18 Claims, 8 Drawing Sheets

(56) References Cited

U.S. PATENT DOCUMENTS

| | | | | |
|---|---|---|---|---|
| 2009/0327845 A1* | 12/2009 | Currivan | ........... | H03M 13/2707 |
| | | | | 714/777 |
| 2010/0050057 A1* | 2/2010 | Luby | ..................... | H04L 1/0041 |
| | | | | 714/776 |
| 2010/0054376 A1* | 3/2010 | Park | ..................... | H03M 13/253 |
| | | | | 375/341 |
| 2010/0085221 A1* | 4/2010 | Monro | ................ | H03M 7/3082 |
| | | | | 341/65 |
| 2010/0100791 A1* | 4/2010 | Abu-Surra | .......... | H03M 13/118 |
| | | | | 714/752 |
| 2010/0296432 A1* | 11/2010 | Mehta | ................ | H04B 7/15592 |
| | | | | 370/315 |
| 2011/0083055 A1* | 4/2011 | Heo | .................. | H03M 13/1105 |
| | | | | 714/755 |
| 2011/0241911 A1* | 10/2011 | Yang | ................. | H03M 13/3761 |
| | | | | 341/52 |
| 2013/0308700 A1* | 11/2013 | Koike-Akino | ... | H04N 19/00236 |
| | | | | 375/240.07 |
| 2014/0169261 A1* | 6/2014 | Ming | ..................... | H04W 88/04 |
| | | | | 370/315 |

OTHER PUBLICATIONS

Nodin, L.; Apavatjrut, A.; Goursaud, C.; Gorce, Jean-Marie, "Degree Distribution of Xored Fountain Codes: Theoretical Derivation and Analysis," Communications (APCC), 2010 16th Asia-Pacific Conference On , vol., No., pp. 23,28, Oct. 31, 2010-Nov. 3, 2010.*

Lin Xuehong; Xie Fei; Lin Jiaru, "Designing of Fountain Codes in Cooperative Relay Systems," Networks Security Wireless Communications and Trusted Computing (NSWCTC), 2010 Second International Conference On , vol. 2, No., pp. 146,149, Apr. 24-25, 2010.*

\* cited by examiner

APPARATUS AND METHOD FOR TRANSMITTING DATA USING FOUNTAIN CODE IN WIRELESS COMMUNICATION SYSTEM

CROSS-REFERENCE TO RELATED APPLICATION(S)

This application claims the benefit under 35 U.S.C. §119 (a) of a Korean patent application filed on Apr. 1, 2013 in the Korean Intellectual Property Office and assigned Serial No. 10-2013-0035066, the entire disclosure of which is hereby incorporated by reference.

JOINT RESEARCH AGREEMENT

The present disclosure was made by or on behalf of the below listed parties to a joint research agreement. The joint research agreement was in effect on or before the date the present disclosure was made and the present disclosure was made as a result of activities undertaken within the scope of the joint research agreement. The parties to the joint research agreement are 1) Samsung Electronics Co., Ltd., and 2) Korea University Research and Business Foundation.

TECHNICAL FIELD

The present disclosure relates to an apparatus and method for transmitting data using a fountain code in a wireless communication system.

BACKGROUND

Fountain codes are typical channel erasure error correction codes that can achieve a channel capacity by using encoding symbols equal to or slightly larger than the number of messages in an algorithm of low complexity. The fountain code is more effective in a broadcasting system where a plurality of receivers exist because it is determined whether data can be restored or not based on only the number of received symbols. For example, a Luby Transform (LT) code using a Robust Soliton Distribution (RSD), a raptor code included in the $3^{rd}$ Generation Partnership Project (3GPP) Multimedia Broadcast and Multicast System (MBMS) standard, etc. are known as fountain codes.

When an environment that ensures reception of a plurality of symbols is not guaranteed, the receiver succeeds in restoring the symbols with very low probability. Research on a fountain code design for maximizing a symbol restoration probability when the number of received encoding symbols is smaller than the number of messages is ongoing. Furthermore, research on a code design for maximizing an average symbol restoration probability when the number of received encoding symbols is a random variable is also ongoing.

It is not always guaranteed that the number of received encoding symbols is larger than the number of messages. Accordingly, there is a need for a fountain code design when the number of received encoding symbols is smaller than the number of messages. However, existing research limits a channel erasure rate to a fixed constant value and thus an optimal code design cannot be achieved when a broadcasting service requiring a plurality of receivers is provided. Accordingly, there is a need to provide a new fountain code and a degree distribution considering a more accurate channel erasure model than a fountain code defined on the premise of a fixed channel erasure rate in a wireless communication system.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a new fountain code and a degree distribution considering a more accurate channel erasure model than a fountain code defined on the premise of a fixed channel erasure rate in a wireless communication system.

Another aspect of the present disclosure is to provide an apparatus and method for transmitting data using a fountain code considering a channel erasure rate in a wireless communication system.

In accordance with an aspect of the present disclosure, an operating method of a transmitting end in a wireless communication system is provided. The operating method includes determining a degree distribution of a fountain code based on channel erasure rate information regarding at least one receiving end, performing fountain encoding according to the degree distribution, and transmitting symbols generated by the fountain encoding.

In accordance with another aspect of the present disclosure, a transmitting end apparatus in a wireless communication system is provided. The transmitting end apparatus includes a controller configured to determine a degree distribution of a fountain code based on channel erasure rate information regarding at least one receiving end, and to perform fountain encoding according to the degree distribution, and a transmitter configured to transmit symbols generated by the fountain encoding.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, methods for defining a fountain code considering a channel erasure rate in a wireless communication system and transmitting data using the fountain code will be explained.

Figure 1:
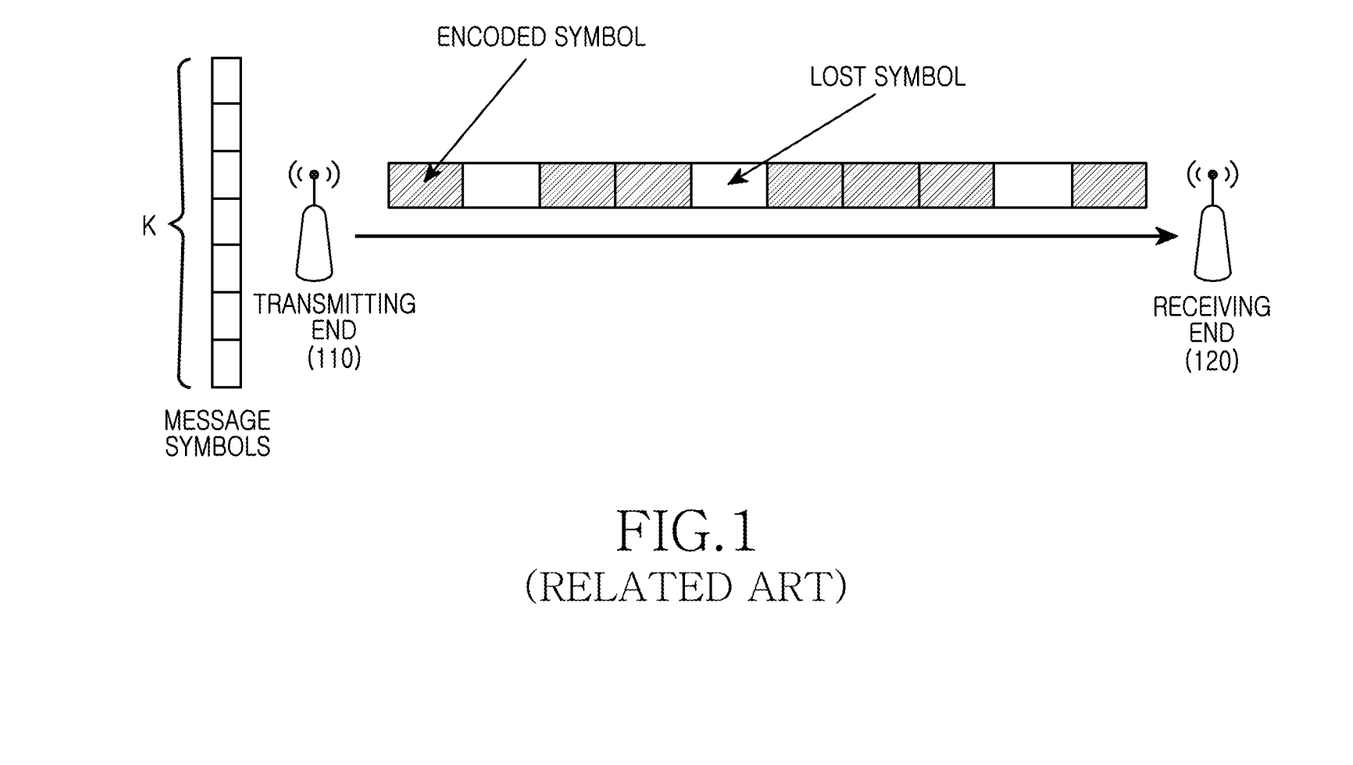
FIG. 1 is a view illustrating characteristics of a fountain code according to the related art.

FIG. 1 illustrates characteristics of a fountain code according to the related art.

Referring to FIG. 1, a transmitting end 110 encodes K number of message symbols using a fountain code and then transmits the encoded symbols to a receiving end 120. In this case, some of the symbols may be lost according to a channel condition. The fountain code is a channel erasure error correction code that is widely used in an application layer. For example, a Luby Transform (LT) code is widely known as a typical fountain code. A code rate of the fountain code is not defined and the fountain code has a characteristic of theoretically generating an infinite number of encoding symbols. The fountain code is defined by a specific degree distribution.

Figure 2:
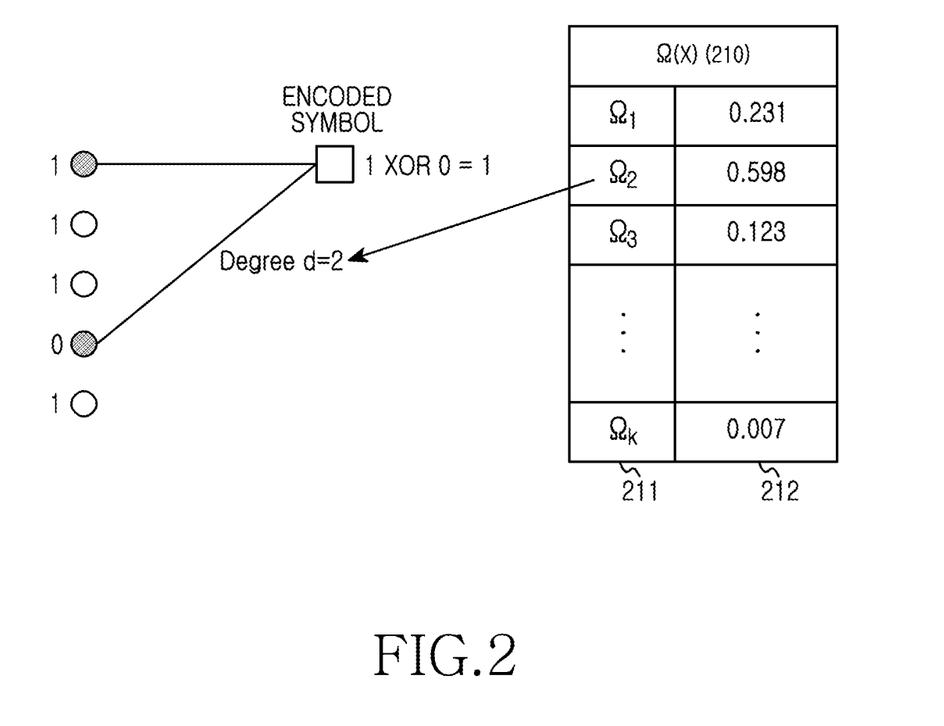
FIG. 2 is a view illustrating an example of encoding of a fountain code in a wireless communication system according to an embodiment of the present disclosure.

FIG. 2 is a view illustrating an example of encoding of a fountain code in a wireless communication system according to an embodiment of the present disclosure.

Referring to FIG. 2, a degree distribution $\Omega(x)$ 210 includes $\Omega_1$ to $\Omega_K$. In the table shown in FIG. 2, a first column 211 means $\Omega_i$ and a second column 212 means a distribution probability of the corresponding $\Omega_i$. As shown in FIG. 2, $\Omega_2$ is defined as 0.598, which means that an occurrence probability of symbols encoded from two messages is 0.598. In this case, each symbol is generated by an eXclusive OR (XOR) operation of selected messages. In other words, when a degree is determined by a given degree distribution, the transmitting end uniformly selects as many message symbols as the number of degrees, and generates encoding symbols by using the XOR operation. The receiving end decodes the received encoding symbols by means of a Message Passing (MP) algorithm.

In this case, a success rate in restoring the messages is determined by the number of received encoding symbols. A ratio between the number of received encoding symbols and the number of messages is defined as a reception overhead. The LT code using the Robust Soliton Distribution (RSD) has a function of minimizing the reception overhead necessary to restore all of the messages. In this case, it is assumed that the reception overhead exceeds 1 and the overhead exceeding 1 means that the number of received encoding symbols should be larger than the number of messages. Since all of the messages can be decoded at the low overhead at low complexity, the fountain code may be widely used in application fields such as multimedia streaming.

Much research to increase the symbol restoration probability in a section where the reception overhead is less than 1 has been conducted. The research to increase the symbol restoration probability started with prediction of a maximum performance that can be achieved in each section of the reception overhead and theoretical determination of a corresponding degree distribution.

Figure 3:
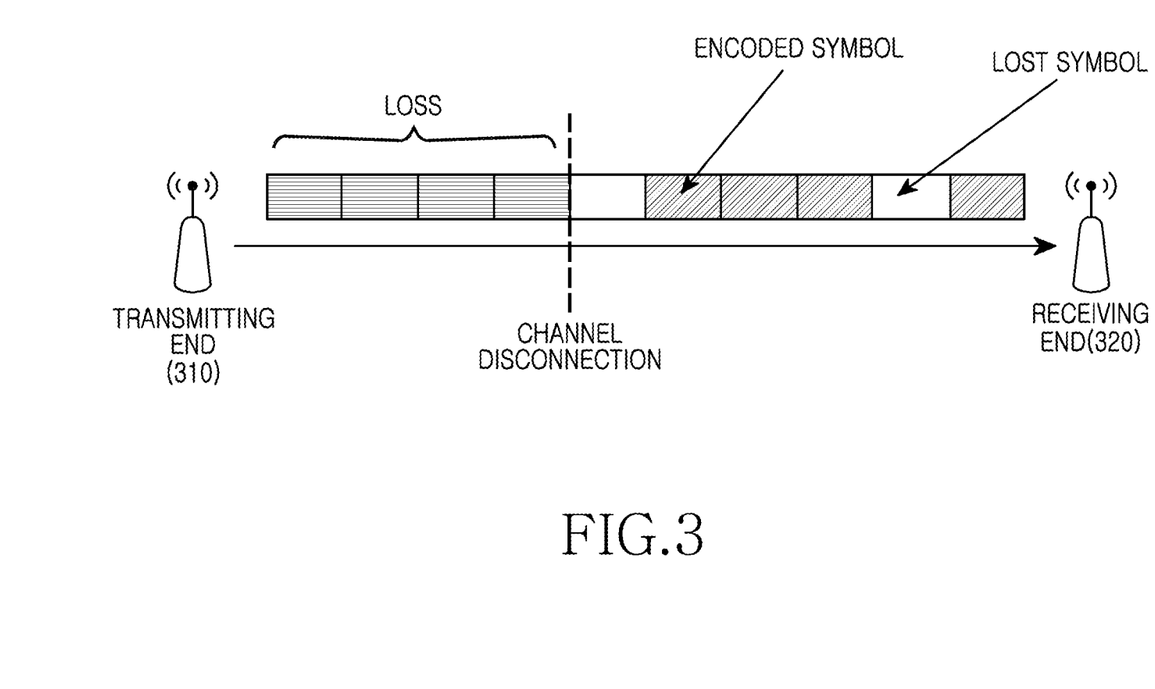
FIG. 3 is a view illustrating an example of a symbol loss when a channel is disconnected in a wireless communication system according to an embodiment of the present disclosure.

The present disclosure proposes a method for determining a degree distribution of a fountain code considering a situation where a channel is disconnected, an example of which is as shown in FIG. 3.

FIG. 3 is a view illustrating an example of a symbol loss when a channel is disconnected in a wireless communication system according to an embodiment of the present disclosure.

Referring to FIG. 3, a transmitting end 310 transmits symbols encoded according to a fountain code to a receiving end 320. Some of the symbols may be lost according to a channel condition during the transmission. In this case, the channel is disconnected at a specific time, and consequently, all of the symbols cannot be transmitted to the receiving end 320 after the channel is disconnected. Accordingly, a situation in which the reception overhead is less than 1 arises.

Figure 4:
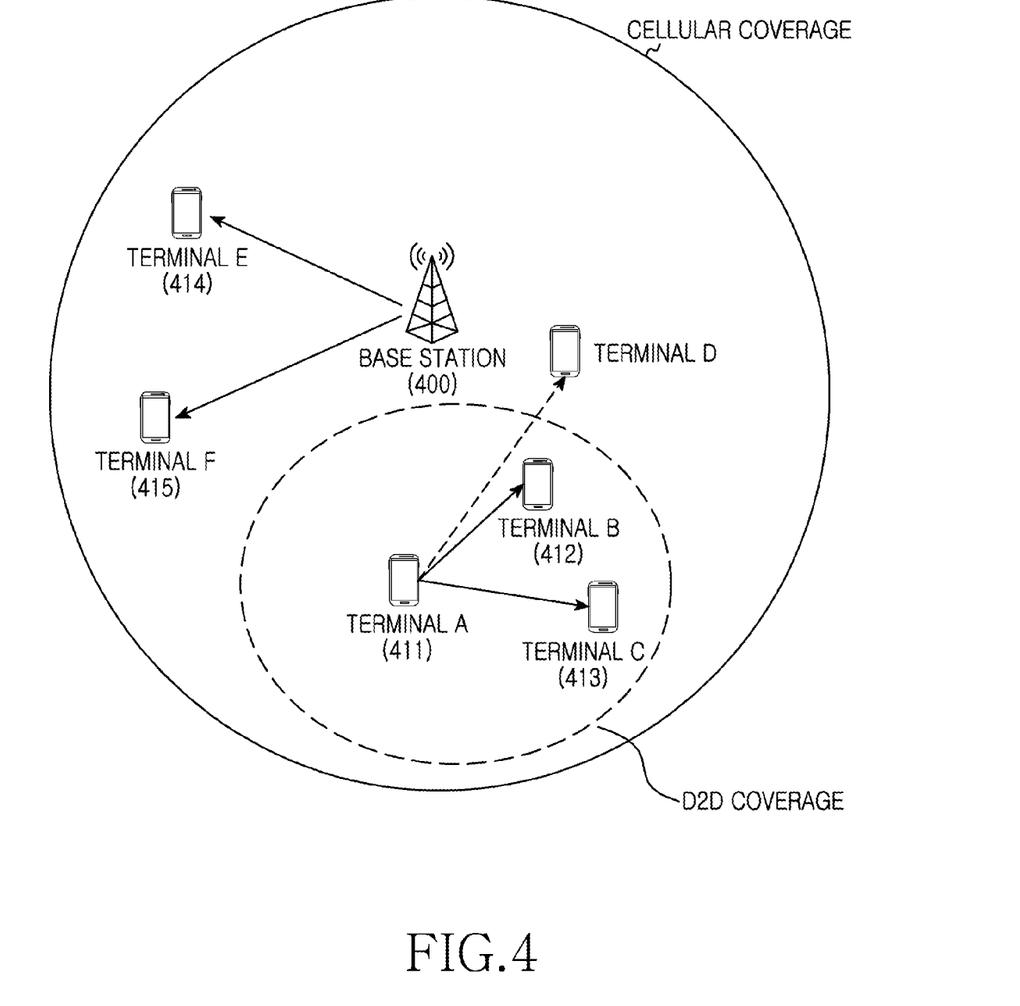
FIG. 4 is a view illustrating a communication environment of a wireless communication system according to an embodiment of the present disclosure.

The channel may be disconnected in an environment as shown in FIG. 4.

FIG. 4 is a view illustrating a communication environment of a wireless communication system according to an embodiment of the present disclosure.

Referring to FIG. 4, a base station 400 has a predetermined geographical area of cellular coverage and can communicate with terminals located within the cellular coverage area. In the case of FIG. 4, a terminal E 414 and a terminal F 415 communicate with the base station 400.

In addition, a system according to an embodiment of the present disclosure supports Device-to-Device (D2D) communication. The D2D communication is a communication method that directly transmits data among the terminals without passing through the base station 400. In the case of FIG. 4, a terminal A 411, a terminal B 412, a terminal C 413, and a terminal D 414 perform the D2D communication. According to an embodiment of the present disclosure, a cellular network-based D2D communication method, which is capable of saving power, frequency resources, etc. may be performed. When the cellular network-based D2D communication is performed, the terminals 411, 412, 413, and 414 are controlled by the base station 400 in relation to resource allocation, power control, etc. In addition, it is possible to generate a link and transmit data when the terminals 411, 412, 413, and 414 to perform the D2D communication exist within the cellular coverage area of the base station 400. In this case, the terminal A 411 broadcasts data to the terminal B 412, the terminal C 413, and the terminal D 414. Accordingly, the terminal A 411 has D2D coverage.

When the terminal E 414 or the terminal F 415 deviates from the cellular coverage area during the cellular communication between the base station 400 and the terminal E 414 and the terminal F 415, the channel may be disconnected. In addition, when the terminal B 412, the terminal C 413, or the terminal D 414 deviates from the D2D coverage of the terminal A 411 during the D2D communication, the channel may be disconnected.

When a transmitting terminal moves to a neighboring cell or a receiving terminal deviates from a broadcasting coverage of the transmitting terminal on the assumption that the cellular network-based D2D communication is performed, the link may be disconnected. Accordingly, the requirement that the reception overhead should be greater than 1 may not be satisfied, and, when the RSD is used, the symbol restoration probability is very low. The number of encoding symbols that can be transmitted through a D2D channel is determined by a life time of the transmitting terminal, the number of transmittable symbols, and a channel erasure rate. In addition, a mathematical model of the reception overhead may be determined based on principles of a Markov chain.

When each terminal has mobility in the D2D-based broadcasting environment, the channel erasure rate cannot be considered as a fixed constant. Accordingly, in the system according to the embodiment of the present disclosure, the transmitting terminal collects channel erasure rate information from each receiving terminal when the link is established. The number of symbols that can be transmitted until the channel is disconnected after the link was established is defined as a random variable, and the number of received symbols is determined according to the channel erasure rate. When a plurality of receiving ends are considered as in a broadcasting service, a plurality of different erasure rates exist. Accordingly, the present disclosure stochastically models the number of received encoding symbols considering the erasure rates of all of the receiving ends, and determines a corresponding probability distribution of the reception overhead. The present disclosure proposes a method for more accurately calculating a probability distribution of a reception overhead by using channel erasure rate information in a D2D-based broadcasting service, and a fountain code design method and an order distribution applying the same.

Hereinafter, a method for determining a degree distribution of a fountain code according to an embodiment of the present disclosure will be briefly described.

First, a transmitting end calculates an accurate probability distribution of a reception overhead by applying a channel erasure rate defined as a random variable based on a probability distribution of a channel life time. Thereafter, the transmitting end defines an average symbol restoration probability for minimizing a difference with an upper bound of an intermediate performance, as an objective function, and sets an optimization problem including a constraint condition that all probability values of a degree distribution are positive numbers and a sum of the probability values is 1. The intermediate performance recited herein indicates a probability that, when the number of messages to be transmitted is K, the receiving end that has received encoding symbols less than K can restore the symbols. In addition, the upper bound of the intermediate performance may be pre-defined. Thereafter, the transmitting end designs an optimal degree distribution. For example, the transmitting end may apply a probability distribution of a new reception overhead to a Sequential Quadratic Programming (SQP) algorithm. The SQP algorithm is a kind of quadratic programming method for making a function value effectively converge when a function to optimize is a multivariate non-linear function. More specifically, the SQP algorithm finds a local minimum of an objective function that is defined as a non-linear function in an area where the constraint condition of the optimization problem is satisfied, and finds an optimal function value in an experimental method when the objective function is a recursive function. Since the SQP algorithm is an algorithm for finding a local minimum, a different result may be derived according to an initial value of $\Omega(x)$. However, the present disclosure has confirmed that the same result was derived regardless of an initial value.

An embodiment of the present disclosure provides a method for designing a degree distribution of a fountain code to have a maximum symbol restoration probability when a transmitting end collects erasure rate information of each receiving end in an environment where a plurality of receiving ends having mobility exist.

A final optimization problem of the degree distribution design is expressed by Equation 1:

$$\min_{\Omega(x)} \int_0^\infty Pr\{R=r\} \cdot (U(r) - s(r, \Omega(x)) dr \quad \text{Equation 1}$$

$$\text{s.t.} \sum_i \Omega_i = 1, \Omega_i \geq 0$$

where $\Omega(x)$ is a degree distribution, $\Omega_i$ is a probability that a symbol having a degree-i is generated, r is a ratio of the number of encoding symbols received at a receiver (=n) to the total number of message symbols (=k) (=n/k), U(r) is an upper bound of an intermediate performance of a fountain code, and $s(r, \Omega(x))$ is an intermediate performance when a fountain code symbol encoded with the degree distribution $\Omega(x)$ has an overhead of r.

The terms constituting the optimization problem shown in Equation 1 may be arranged as 3 terms of an objective function and 2 terms of the constraint condition.

$\Omega_i$ included in the constraint condition is the degree distribution of the fountain code, namely a probability that the encoding symbol has a degree-i. Accordingly, the sum of $\Omega_i$ for all of i is 1 and each $\Omega_i$ has a value greater than or equal to 0. The degree distribution $\Omega(x)$ may be expressed in the form of a vector like $[\Omega_1, \Omega_2, \Omega_3, \ldots]$ or may be expressed in the form of a polynomial like $\lceil \Omega_1(x) = \Omega_1 x + \Omega_2 x^2 + \Omega_3 x^3 + \ldots \rfloor$ The above polynomial may be termed as a generator polynomial.

The function U(r) included in the objective function indicates the upper bound of the intermediate performance of the fountain code. The intermediate performance means a 1-Symbol Error Rate (SER) and r indicates the ratio of the number of encoding symbols received at the receiver (=n) to the total number of message symbols (=k) (=n/k). U(r) cannot be expressed in a closed form. Theoretically, since an information restoration rate cannot be greater than an amount of information of received encoding symbols, U(r) has a function value less than an equality function (y=x). Accordingly, when r is 1, the message symbol restoration probability converges to 1 based on the asymptotic assumption.

In Equation 1, $s(r, \Omega(x))$ indicates the intermediate performance when the fountain code symbol encoded with the degree distribution $\Omega(x)$ has the overhead of r. The intermediate performance may be determined by Equation 2:

$$s(r, \Omega(x)) = 1 - \lim_{l \to \infty} y_l \quad \text{Equation 2}$$

$$y_{l+1} = \exp\{r\Omega'(1 - y_l)\}$$

where $s(r, \Omega(x))$ is the intermediate performance when the fountain code symbol encoded with the degree distribution $\Omega(x)$ has the overhead of r, r is the ratio of the number of encoding symbols received at the receiver to the total number of message symbols, $\Omega(x)$ is the degree distribution, $y_1$ is a restoration failure probability of the symbol, and $\Omega'$ is a differential of the degree distribution. The limiting value limy, is an AND-OR tree analysis equation which is an asymptotic analysis tool of the fountain code. $y_1$ is a recursively updated value and converges to a value between 0 and 1 when l is sufficiently great.

As described above, $y_1$ is the probability that the message symbol of the fountain code fails to be restored. It is common that $y_1$ is a decreasing function and its function value is closer to 0 when l increases. In the case of Equation 2, a convergence value of $y_1$ is determined by r and $\Omega(x)$ and eventually the above-described optimization problem is equivalent to a problem for minimizing an average value of $y_1$. As the length of the message of the fountain code increases, a result of the AND-OR tree analysis is consistent with a result of the asymptotic analysis. However, since complexity is very low in comparison with a performance analysis tool for a finite message length, the present disclosure uses the AND-OR tree analysis method.

$(U(r)-s(r, \Omega(x))$ included in Equation 1 denotes a difference between the upper bound of the performance for the overhead r and the performance when the degree distribution $\Omega(x)$ is used, and is always a positive number. An average of the difference values in the performance may be determined by marginalizing the difference in the performance with respect to the random variable R, and minimizing the average of the difference values in the performance is a solution of Equation 1.

$Pr\{R=r\}$ included in Equation 1 is a probability distribution of an overhead at which the receiving end succeeds in receiving. The probability distribution may be expressed by using a channel life time and an erasure rate of an encoding symbol.

The life time of the channel may be modeled based on an exponential distribution expressed by Equation 3 presented below. In the system according to the embodiment of the present disclosure, the channel is disconnected on two occasions, namely when a transmitter deviates from a cell and when a receiver deviates from a coverage of the transmitter. It may be assumed that there is a constant probability that the above-described two occasions arise at a certain time, which means that the channel life time on the two occasions follows the exponential distribution. The exponential distribution is a distribution having a unit factor $\lambda$, which is equal to an average value of the random variables. Two random variables $T_1$ and $T_2$ are defined as a random variable indicating the number of symbols transmitted until the transmitting end deviates from the cell and a random variable indicating the number of symbols transmitted until the receiving end deviates from the coverage of the transmitting end, and averages of respective random variables are defined as $\lambda_1$ and $\lambda_2$. Since the channel is disconnected by the lower one of the two random variables, a time T at which the channel is disconnected is $T=\min(T_1, T_2)$ and the random value T has an exponential distribution as in Equation 3:

$$Pr\{T=t\} = \frac{1}{\lambda}\exp\left(-\frac{t}{\lambda}\right) \quad \text{Equation 3}$$

where $$\lambda = \left(\frac{1}{\lambda_1} + \frac{1}{\lambda_2}\right)^{-1}$$

where $Pr\{T=t\}$ is a probability that a channel disconnection time is t, $\lambda$, is a factor of an exponential distribution regarding the channel life time, $\lambda_1$ is a random variable indicating the number of symbols transmitted until the transmitting end deviates from the cell, and $\lambda_2$ is a random variable indicating the number of symbols transmitted until the receiving end deviates from the coverage of the transmitting end.

As in Equation 3, the probability distribution of the channel life time may be determined by at least one of an average of the deviation probability that the transmitting end deviates from the area where the transmitting end is communicable with the at least one receiving end, and an average of the deviation probability that the at least one receiving end deviates from the area where the receiving end is communicable with the transmitting end. The deviation probability may be determined in various ways according to an embodiment. For example, the deviation probability may be obtained from a pre-defined system model. Alternatively, the deviation probability may be calculated based on the size of the communicable area and moving speeds of the transmitting end and the receiving end. Alternatively, the deviation probability may be calculated based on statistics on a previous deviation history.

In Equation 3, a unit of t is the number of encoding symbols transmitted until the channel is disconnected. When the variable is substituted with T=kR in order to represent the probability distribution regarding T as the probability distribution regarding the overhead R and a Jacobean between T and R is multiplied, the random variable may be expressed by Equation 4:

$$Pr\{R=r \mid \varepsilon = 0\} = \frac{k}{\lambda}\exp\left(-\frac{kr}{\lambda}\right) \quad \text{Equation 4}$$

where $\varepsilon$ is an erasure rate, r is the ratio of the number of encoding symbols received at the receiving end to the total number of message symbols, $Pr\{R=r|\varepsilon=0\}$ is a probability that, when the erasure rate is 0, the overhead is r, k is the total number of message symbols, and $\lambda$, is a factor of the exponential distribution regarding the channel life time.

Considering the erasure rate $\varepsilon$ in Equation 4, the overhead of the receiving end does not accurately follow the exponential distribution. However, the overhead of the receiving end may be approximated to the exponential distribution. The probability distribution of the overhead r considering the erasure rate $\varepsilon$ may be expressed by Equation 5:

$$Pr\{R=r \mid \varepsilon = v\} = \frac{k}{\lambda(1-v)}\exp\left(-\frac{kr}{\lambda(1-v)}\right) \quad \text{Equation 5}$$

where $\varepsilon$ is the erasure rate, r is the ratio of the number of encoding symbols received at the receiver to the total number of message symbols, $Pr\{R=r|\varepsilon=v\}$ is a probability that, when the erasure rate is v, the overhead is r, k is the total number of message symbols, and $\lambda$, is the factor of the exponential distribution regarding the channel life time.

The final overhead probability distribution used in Equation 1 may be determined by marginalizing Equation 5 with respect to the variable $\varepsilon$ as in Equation 6 presented below:

$$Pr\{R = r\} = \sum_{v} Pr\{R = r \mid \varepsilon = v\} \cdot Pr\{\varepsilon = v\} \qquad \text{Equation 6}$$

where $\epsilon$ is the erasure rate, r is the ratio of the number of encoding symbols received at the receiver to the total number of message symbols, $Pr\{R=r\}$ is the probability that the overhead is r, $Pr\{R=r|\epsilon=v\}$ is the probability that, when the erasure rate is v, the overhead is r, and $Pr\{\epsilon=v\}$ is a probability that the erasure rate is v.

The transmitting end may know $Pr\{\epsilon=v\}$ based on the erasure rate information measured and fed back by each receiving end. When the number of receiving ends is N and the erasure rate measured by each receiving end is one of $\epsilon_1$ to $\epsilon_N$, $Pr\{\epsilon=v\}$ may be expressed by Equation 7:

$$Pr\{\varepsilon = v\} = \frac{1}{N}\sum_{i=1}^{N} \delta(v - \varepsilon_i) \qquad \text{Equation 7}$$

where $\epsilon$ is the erasure rate, $Pr\{\epsilon=v\}$ is the probability that the erasure rate is v, N is the number of receiving ends providing the erasure rate, $\delta$ ( ) is a unit impulse function defined in a continuous variable, and $\epsilon_i$ is an erasure rate of a receiving end-i.

The process of determining the degree distribution of the fountain code according to the embodiment of the present disclosure described above is based on the premise that the single transmitting end broadcasts data to the plurality of receiving ends. However, the present disclosure can be applied in the same way when a single transmitting end and a single receiving end communicate with each other in a unicast method.

Figure 5:
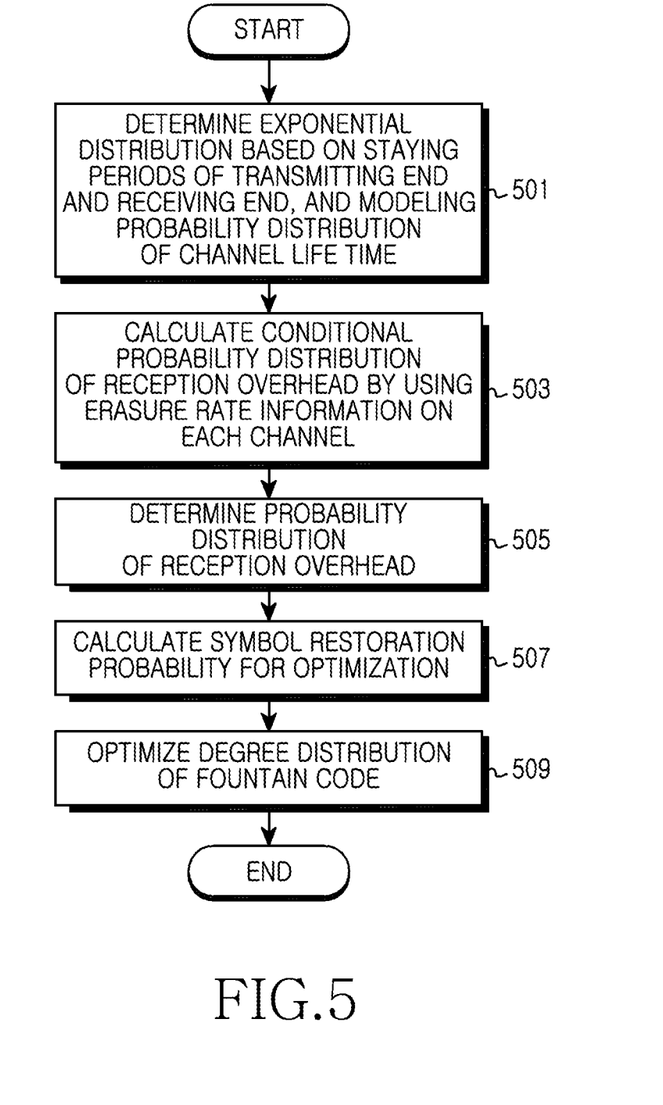
FIG. 5 is a view illustrating a procedure for determining a degree distribution of a fountain code in a wireless communication system according to an embodiment of the present disclosure.

FIG. 5 is a view illustrating a procedure for determining a degree distribution of a fountain code in a wireless communication system according to an embodiment of the present disclosure. In the following description, a subject that determines the degree distribution will be called a "generator" for the convenience of explanation.

Referring to FIG. 5, the generator determines an exponential distribution based on a staying time of a transmitting end and a receiving end, and models a probability distribution of a channel life time in operation 501. For example, the probability distribution of the channel life time may be modeled as in Equation 3 described above.

In operation 503, the generator collects erasure rate information on each channel and calculates a conditional probability distribution of a reception overhead by using the erasure rate information. For example, the conditional probability distribution may be calculated as in Equation 5 described above.

In operation 505, the generator determines a probability distribution of the reception overhead. That is, the generator may determine the probability distribution of the reception overhead by adding up the products of the conditional probability of the reception overhead and the occurrence probability of the condition with respect to all of the erasure rates. For example, the probability distribution of the reception overhead may be determined as in Equation 6 described above.

In operation 507, the generator calculates a symbol restoration probability for optimization. For example, the generator may calculate the symbol restoration probability by using an AND-OR tree analysis method. For example, the symbol restoration probability may be calculated as in Equation 2 described above.

In operation 509, the generator optimizes the degree distribution of the fountain code. For example, the generator may optimize the degree distribution by using the SQP. That is, the generator determines a solution to the optimization problem shown in Equation 1.

Figure 6:
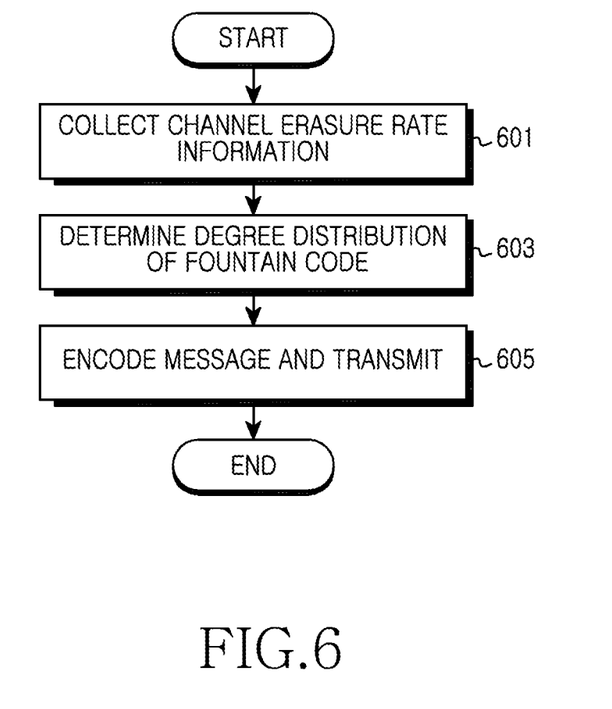
FIG. 6 is a view illustrating an operation procedure of a transmitting end in a wireless communication system according to an embodiment of the present disclosure.

FIG. 6 is a view illustrating an operating procedure of a transmitting end of a wireless communication system according to an embodiment of the present disclosure.

Referring to FIG. 6, the transmitting end collects channel erasure rate information in operation 601. For example, the transmitting end is fed back with the channel erasure rate by at least one receiving end. That is, the at least one receiving end generates the channel erasure rate information indicating a length of time until the channel is disconnected after a link was established, and feeds the channel erasure rate information back to the transmitting end. A format of the channel erasure rate information may vary according to an embodiment of the present disclosure. For example, the channel erasure rate information may indicate the length of time described above or may indicate the number of symbols received during the length of time. The channel erasure rate information may be an instantaneous value or a statistical value.

After collecting the channel erasure rate information, the transmitting end proceeds to operation 603 to determine a degree distribution of a fountain code. In other words, the transmitting end grasps a current channel erasure rate probability distribution based on the collected channel erasure rate information, and determines the degree distribution of the fountain code optimized to the erasure rate probability distribution. For example, the transmitting end determines a probability distribution of a channel life time, determines a conditional probability distribution of a reception overhead which is conditional on the channel erasure rate by using the probability distribution of the channel life time, and determines a probability distribution of the reception overhead by using the collected channel erasure rate information. The transmitting end calculates a symbol restoration probability based on the probability distribution of the reception overhead, and determines the degree distribution to minimize a difference between an upper bound of an intermediate performance of the fountain code and an intermediate performance according to the symbol restoration probability. For example, the transmitting end may determine the degree distribution through the procedure shown in FIG. 5.

After determining the degree distribution of the fountain code, the transmitting end proceeds to operation 605 to encode messages and transmit encoded symbols. For example, the transmitting end uniformly selects message symbols as many as each degree included in the degree distribution, and calculates the selected message symbols by using a pre-defined operation, thereby generating encoding symbols. For example, the pre-defined operation may include an XOR operation.

Figure 7:
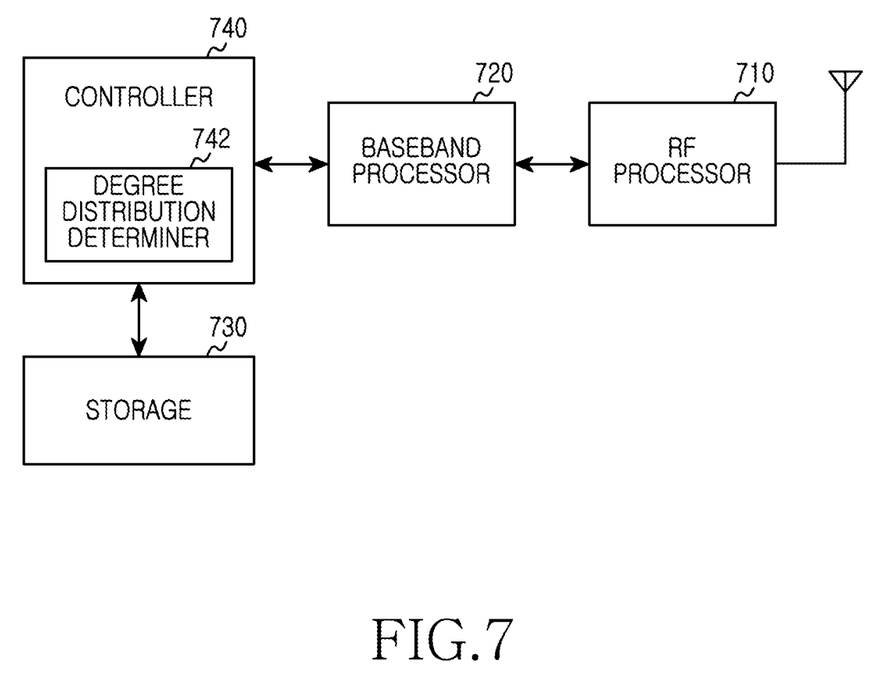
FIG. 7 is a view illustrating a block configuration of a transmitting end in a wireless communication system according to an embodiment of the present disclosure.

FIG. 7 is a view illustrating a block configuration of a transmitting end in a wireless communication system according to an embodiment of the present disclosure.

Referring to FIG. 7, the transmitting end includes a Radio Frequency (RF) processor 710, a baseband processor 720, a storage 730, and a controller 740.

The RF processor 710 performs a function of transmitting and receiving signals, such as signal band conversion, amplification, etc., through a wireless channel. That is, the RF processor 710 up-converts a baseband signal provided from the baseband processor 720 into an RF band signal and transmits the RF band signal through an antenna, and down-converts an RF band signal received through the antenna into a baseband signal. For example, the RF processor 710 may include a transmission filter, a reception filter, an amplifier, a mixer, an oscillator, a Digital to Analog Converter (DAC), an Analog to Digital Converter (ADC), etc. Although only a single antenna is illustrated in FIG. 7, the transmitting end may include a plurality of antennas. In addition, the RF processor 710 may include a plurality of RF chains.

The baseband processor 720 performs a conversion function between the baseband signal and a bit string according to a physical layer standard of the system. For example, when transmitting data, the baseband processor 720 generates complex symbols by encoding and modulating a transmission bit string. In addition, when receiving data, the baseband processor 720 restores a reception bit string by demodulating and decoding the baseband signal provided from the RF processor 710.

The baseband processor 720 and the RF processor 710 transmit and receive the signals as described above. Accordingly, the baseband processor 720 and the RF processor 710 may be referred to as a transmitter, a receiver, or a transceiver.

The storage 730 stores data for operating the transmitting end such as a basic program, an application program, setting information, etc. In particular, the storage 730 stores the degree distribution of the fountain code and information necessary for determining the degree distribution. In addition, the storage 730 provides the stored data according to a request of the controller 740.

The controller 740 controls overall operations of the transmitting end. For example, the controller 740 transmits and receives signals through the baseband processor 720 and the RF processor 710. According to an embodiment of the present disclosure, the controller 740 includes a degree distribution determiner 742 to determine the degree distribution of the fountain code optimized to the channel erasure rate probability distribution of the current channel. For example, the controller 740 controls the transmitting end to perform the procedures shown in FIGS. 5 and 6. Operations of the controller 740 according to the embodiment of the present disclosure are described below.

First, the controller 730 collects channel erasure rate information. For example, the controller 730 is fed back with the channel erasure rate by at least one receiving end. A format of the channel erasure rate information may vary according to an embodiment. For example, the channel erasure rate information may indicate the length of time, as described above, or may indicate the number of symbols received during the length of time. In addition, the channel erasure rate information may be an instantaneous value or a statistical value. After collecting the channel erasure rate information, the controller 730 determines a degree distribution of a fountain code. In other words, the controller 730 grasps a current channel erasure rate probability distribution based on the collected channel erasure rate information, and determines a degree distribution of a fountain code optimized to the erasure rate probability distribution. For example, the controller 730 may determine the degree distribution through the procedure shown in FIG. 5. Thereafter, the controller 730 encodes messages according to the degree distribution and transmits encoded symbols.

Figure 8:
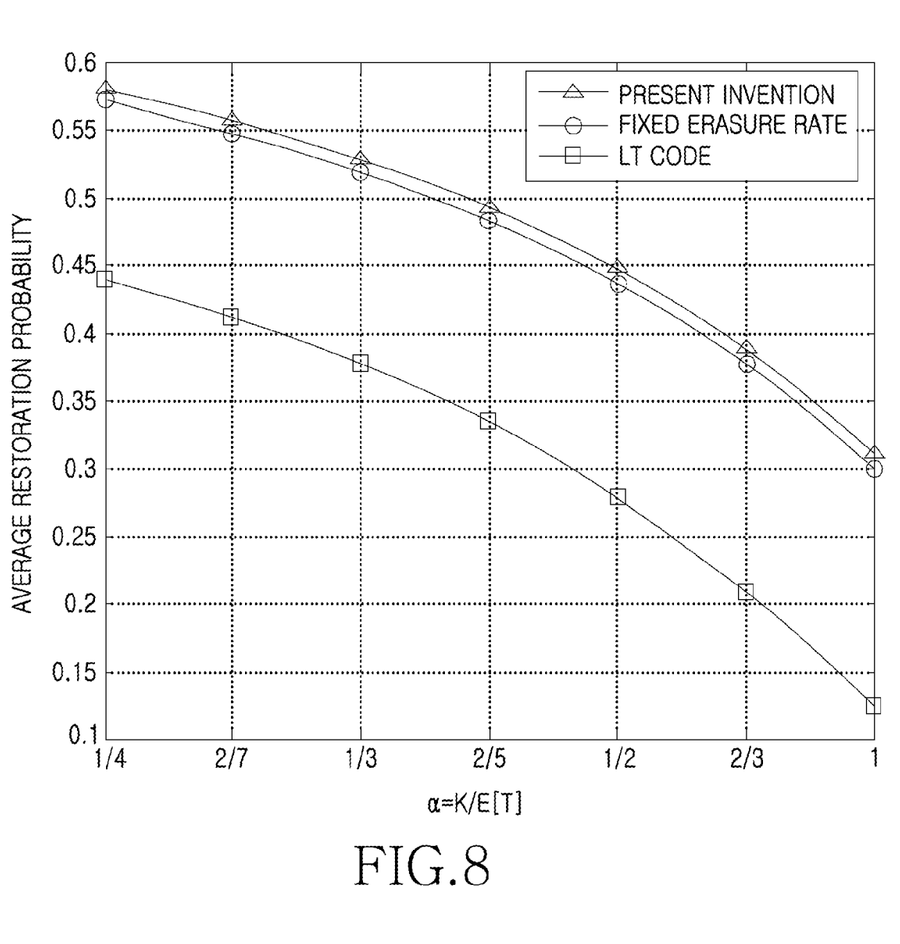
FIG. 8 is a view illustrating a performance of a wireless communication system according to an embodiment of the present disclosure.

FIG. 8 is a view illustrating a performance of a wireless communication system according to an embodiment of the present disclosure.

Referring to FIG. 8, a simulation result of a system according to the present disclosure, an LT code, and a fixed erasure rate are applied is illustrated.

The simulation used a well-known SQP algorithm to obtain a solution to an optimization algorithm of Equation 1. That is, the simulation optimized a degree distribution by using the SQP. When an average value $E[T]$ of a channel life time is modeled in a D2D communication environment, it is reasonable to use a message length K smaller than $E[T]$ to restore symbols. The simulation supposed that K is determined by a specific ratio $\alpha$ of observed $E[T]$ as in Equation 8:

$$K = \alpha \cdot E[T] \qquad \text{Equation 8}$$

where K is a message length, $E[T]$ is an average value of a channel life time, and $\alpha$ is a ratio between the average of the channel life time and the message length.

When the average of the channel erasure rate is 0.25 and the distribution is $Pr\{\epsilon=0.1\}=0.4$, $Pr\{\epsilon=0.2\}=0.2$, $Pr\{\epsilon=0.3\}=0.1$, $Pr\{\epsilon=0.4\}=0.1$, and $Pr\{\epsilon=0.5\}=0.2$, an optimal degree distribution for each $\alpha$ is shown in Table 1:

TABLE 1

| $1/\alpha$ | $\Omega(x)$ |
|---|---|
| 4 | $\Omega_1 = 0.4187$ |
|   | $\Omega_2 = 0.5813$ |
| 3.5 | $\Omega_1 = 0.4531$ |
|   | $\Omega_2 = 0.5469$ |
| 3 | $\Omega_1 = 0.5005$ |
|   | $\Omega_2 = 0.4995$ |
| 2.5 | $\Omega_1 = 0.5711$ |
|   | $\Omega_2 = 0.4289$ |
| 2 | $\Omega_1 = 0.6911$ |
|   | $\Omega_2 = 0.3089$ |
| 1.5 | $\Omega_1 = 0.9696$ |
|   | $\Omega_2 = 0.0304$ |
| 1 | $\Omega_1 = 1$ |
|   | $\Omega_2 = 0$ |

Referring to Table 1, the fountain code according to the embodiment of the present disclosure shows a higher restoration probability for all $\alpha$ values than when the LT code and the fixed erasure rate are used.

It is possible to achieve a more effective code design by designing the degree distribution of the fountain code to maximize the average symbol restoration probability considering the channel erasure rate in the wireless communication system. Consequently, it is possible to maximize the average symbol restoration probability in the system using the fountain code.

Embodiments of the present invention according to the claims and description in the specification can be realized in the form of hardware, software or a combination of hardware and software.

Such software may be stored in a computer readable storage medium. The computer readable storage medium stores one or more programs (software modules), the one or more programs comprising instructions, which when executed by one or more processors in an electronic device, cause the electronic device to perform methods of the present invention.

Such software may be stored in the form of volatile or non-volatile storage such as, for example, a storage device like a Read Only Memory (ROM), whether erasable or rewritable or not, or in the form of memory such as, for example, Random Access Memory (RAM), memory chips, device or integrated circuits or on an optically or magnetically readable medium such as, for example, a Compact Disc (CD), Digital Video Disc (DVD), magnetic disk or magnetic tape or the like. It will be appreciated that the storage devices and storage media are embodiments of machine-readable storage that are suitable for storing a program or programs comprising instructions that, when executed, implement embodiments of the present invention. Embodiments provide a program comprising code for implementing apparatus or a method as claimed in any one of the claims of this specification and a machine-readable storage storing such a program. Still further, such programs may be conveyed electronically via any medium such as a communication signal carried over a wired or wireless connection and embodiments suitably encompass the same.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for operating a transmitting end in a wireless communication system, the method comprising:
   determining a probability distribution of a channel life time regarding a channel with at least one receiving end;
   determining a conditional probability distribution of a reception overhead that is conditional on a channel erasure rate by using the probability distribution of the channel life time;
   determining a probability distribution of the reception overhead by using the channel erasure rate;
   calculating a symbol restoration probability based on the probability distribution of the reception overhead;
   determining a degree distribution to minimize a difference between an upper bound of an intermediate performance of a fountain code and
   an intermediate performance according to the symbol restoration probability;
   performing fountain encoding according to the degree distribution; and
   transmitting symbols generated by the fountain encoding.

2. The method of claim 1, wherein the channel erasure rate information indicates a length of time until a channel is disconnected after a link was established between the transmitting end and the at least one receiving end.

3. The method of claim 2, wherein the channel erasure rate information indicates the length of time or indicates a number of symbols received during the length of time.

4. The method of claim 2, wherein the channel erasure rate information comprises at least one of an instantaneous value and a statistical value.

5. The method of claim 1, wherein the probability distribution of the channel life time is determined by using at least one of an average of a deviation probability that the transmitting end deviates from an area where the transmitting end is communicable with the at least one receiving end, and an average of a deviation probability that the at least one receiving end deviates from an area where the receiving end is communicable with the transmitting end.

6. The method of claim 5, wherein the deviation probability comprises at least one of a defined value that is obtained from a pre-defined system model, a value calculated based on a size of the communicable area and moving speeds of the transmitting end and the receiving end, and a value calculated based on statistics on a deviation history of the transmitting end and the receiving end.

7. The method of claim 1, wherein the probability distribution of the reception overhead is determined by adding up products of a conditional probability of the reception overhead and a corresponding occurrence probability of the channel erasure rate with respect to all erasure rates.

8. The method of claim 1, wherein the symbol restoration probability is determined by using a symbol restoration failure probability which is recursively updated by using the reception overhead and the degree distribution.

9. The method of claim 1, wherein the degree distribution is a degree distribution for minimizing a product of a probability of the reception overhead and a difference of the intermediate performance.

10. An apparatus for a transmitting end in a wireless communication system, the transmitting end apparatus comprising:
    a controller configured to:
        determine a probability distribution of a channel life time regarding a channel with at least one receiving end,
        determine a conditional probability distribution of a reception overhead that is conditional on a channel erasure rate by using the probability distribution of the channel life time,
        determine a probability distribution of the reception overhead by using the channel erasure rate,
        calculate a symbol restoration probability based on the probability distribution of the reception overhead,
        determine a degree distribution to minimize a difference between an upper bound of an intermediate performance of a fountain code and an intermediate performance according to the symbol restoration probability, and
        perform fountain encoding according to the degree distribution; and
    a transmitter configured to transmit symbols generated by the fountain encoding.

11. The apparatus of claim 10, wherein the channel erasure rate information indicates a length of time until a channel is disconnected after a link was established between the transmitting end and the at least one receiving end.

12. The apparatus of claim 11, wherein the channel erasure rate information indicates the length of time or indicates a number of symbols received during the length of time.

13. The apparatus of claim 11, wherein the channel erasure rate information comprises at least one of an instantaneous value and a statistical value.

14. The apparatus of claim 10, wherein the probability distribution of the channel life time is determined by using at least one of an average of a deviation probability that the transmitting end deviates from an area where the transmitting end is communicable with the at least one receiving end, and an average of a deviation probability that the at least one receiving end deviates from an area where the receiving end is communicable with the transmitting end.

15. The apparatus of claim 14, wherein the deviation probability comprises at least one of a defined value that is obtained from a pre-defined system model, a value calculated based on a size of the communicable area and moving speeds of the transmitting end and the receiving end, and a value calculated based on statistics on a deviation history of the transmitting end and the receiving end.

16. The apparatus of claim 10, wherein the probability distribution of the reception overhead is determined by adding up products of a conditional probability of the reception overhead and a corresponding occurrence probability of the channel erasure rate with respect to all erasure rates.

17. The apparatus of claim 10, wherein the symbol restoration probability is determined by using a symbol restoration failure probability which is recursively updated by using the reception overhead and the degree distribution.

18. The apparatus of claim 10, wherein the degree distribution is a degree distribution for minimizing a product of a probability of the reception overhead and a difference of the intermediate performance.

* * * * *